United States Patent
Anderson et al.

(10) Patent No.: US 10,516,076 B2
(45) Date of Patent: Dec. 24, 2019

(54) DISLOCATION FILTER FOR SEMICONDUCTOR DEVICES

(71) Applicant: Silanna UV Technologies Pte Ltd, Singapore (SG)

(72) Inventors: Liam Anderson, Wentworth Point (AU); William Lee, West Ryde (AU); William Schaff, Brisbane (AU); Johnny Cai Tang, Baulkham Hills (AU)

(73) Assignee: Silanna UV Technologies Pte Ltd, Singapore (SG)

( * ) Notice: Subject to any disclaimer, the term of this patent is extended or adjusted under 35 U.S.C. 154(b) by 0 days.

(21) Appl. No.: 15/886,220

(22) Filed: Feb. 1, 2018

(65) Prior Publication Data

US 2019/0237616 A1    Aug. 1, 2019

(51) Int. Cl.
*H01L 33/06* (2010.01)
*H01L 33/32* (2010.01)
*H01L 33/12* (2010.01)

(52) U.S. Cl.
CPC .............. *H01L 33/06* (2013.01); *H01L 33/12* (2013.01); *H01L 33/32* (2013.01)

(58) Field of Classification Search
CPC .......... H01L 33/06; H01L 33/12; H01L 33/32
USPC ...................................................... 257/190
See application file for complete search history.

(56) References Cited

U.S. PATENT DOCUMENTS

| | | |
|---|---|---|
| 6,847,046 B1 | 1/2005 | Wei et al. |
| 7,312,474 B2 | 12/2007 | Emerson et al. |
| 7,326,963 B2 | 2/2008 | Gaska et al. |
| 7,547,925 B2 | 6/2009 | Wong et al. |
| 7,615,772 B2 | 11/2009 | Lee |
| 7,615,804 B2 | 11/2009 | Nagahama et al. |
| 7,652,282 B2 | 1/2010 | Yanagihara |
| 7,822,089 B2 | 10/2010 | Eichler et al. |
| 7,875,534 B2 | 1/2011 | Yu et al. |
| 7,893,424 B2 | 2/2011 | Eichler et al. |
| 7,910,937 B2 | 3/2011 | Chen et al. |
| 7,943,494 B2 | 5/2011 | Wu et al. |
| 8,088,637 B1 | 1/2012 | Wong et al. |
| 8,093,583 B2 | 1/2012 | Lee et al. |
| 8,148,753 B2 | 4/2012 | Oishi et al. |
| 8,154,009 B1 | 4/2012 | Wong et al. |
| RE43,725 E | 10/2012 | Emerson et al. |

(Continued)

FOREIGN PATENT DOCUMENTS

EP     2498282     6/2014

OTHER PUBLICATIONS

Bykhovski, A. D., et al. "Elastic strain relaxation and piezoeffect in GaN—AlN, GaN-AlGaN and GaN-InGaN superlattices," J. Appl. Phys. 81(9), May 1, 1997, p. 6332-6338.

(Continued)

*Primary Examiner* — Mohammad M Hoque
(74) *Attorney, Agent, or Firm* — MLO, a professional corp.

(57) ABSTRACT

A dislocation filter for a semiconductor device has a buffer layer comprising a short-period superlattice (SPSL) layer. The SPSL layer has first sub-layers of a first material that alternate with second sub-layers of a second material, the first material and the second material being group III-N binary materials that are different from each other. Each of the first sub-layers and each of the second sub-layers has a sub-layer thickness less than or equal to 12 monolayers. The buffer layer also includes a third layer of a third material, the third material being a group III-N material. The SPSL forms a sandwich structure with the third layer. The buffer layer bends dislocations away from a growth direction of the buffer layer.

22 Claims, 7 Drawing Sheets

(56) References Cited

U.S. PATENT DOCUMENTS

| | | | |
|---|---|---|---|
| 8,415,654 B2 | 4/2013 | Khan et al. | |
| 8,471,240 B2 | 6/2013 | Eichler et al. | |
| 8,486,807 B2 | 7/2013 | Yu et al. | |
| 8,492,779 B2 | 7/2013 | Lee | |
| 8,519,414 B2 | 8/2013 | Yu et al. | |
| 8,530,935 B2 | 9/2013 | Yanagihara | |
| 8,575,471 B2 | 11/2013 | Norman et al. | |
| 8,592,862 B2 | 11/2013 | Weeks et al. | |
| 8,598,605 B2 | 12/2013 | Sugiyama et al. | |
| 8,633,468 B2 | 1/2014 | Gaska et al. | |
| 8,680,509 B2 | 3/2014 | Ooshika et al. | |
| 8,686,430 B2 | 4/2014 | Chen | |
| 8,716,046 B2 | 5/2014 | Kim et al. | |
| 8,779,468 B2 | 7/2014 | Fang et al. | |
| 8,791,450 B2 | 7/2014 | Shur et al. | |
| 8,847,203 B2 | 9/2014 | Ikuta et al. | |
| 8,865,565 B2 | 10/2014 | Chen | |
| 8,946,723 B2 | 2/2015 | Miyoshi et al. | |
| 8,994,002 B2 | 3/2015 | Lee et al. | |
| 9,130,068 B2 | 9/2015 | Yang et al. | |
| 9,166,031 B2 | 10/2015 | Kotani et al. | |
| 9,196,685 B2 | 11/2015 | Tomabechi et al. | |
| 9,287,455 B2 | 3/2016 | Shur et al. | |
| 9,705,032 B2 | 7/2017 | Shur et al. | |
| 2006/0154455 A1* | 7/2006 | Guo | C30B 29/68 438/483 |
| 2008/0237570 A1 | 10/2008 | Choi et al. | |
| 2012/0104360 A1 | 5/2012 | Hardy et al. | |
| 2012/0126239 A1 | 5/2012 | Keller et al. | |
| 2015/0060759 A1 | 3/2015 | Bedell et al. | |
| 2015/0060765 A1 | 3/2015 | Kotani et al. | |
| 2016/0149075 A1* | 5/2016 | Atanackovic | H01L 33/06 257/13 |
| 2016/0163920 A1* | 6/2016 | Atanackovic | H01L 33/325 257/13 |
| 2016/0240679 A1 | 8/2016 | Chen et al. | |

OTHER PUBLICATIONS

Chen, Hung-Chi, "Dislocation Reduction in Silicon Doped High Aluminum Content Algan Layers for Deep UV Optoelectronic Devices," Doctoral dissertation, University of South Carolina, Jan. 1, 2013. http://scholarcommons.sc.edu/etd/2405.

Fu et al. "Relaxation of compressive strain by inclining threading dislocations in Al0. 45Ga0. 55N epilayer grown on AlN/sapphire templates using graded-AlxGa1—xN/Aln multi-buffer layers," Journal of Physics D: Applied Physics, vol. 42, No. 3, p. 035311, 2009.

Jourba et al., "High-quality highly strained InGaAs quantum wells grown on InP using (InAs)n(GaAs)0.25 fractional monolayer superattices," Appl. Phys. Lett. 75, 220 (May 1999); https://doi.org//10.1063/1.124328.

Khan, Asif, "AlInGaN-Based Deep Ultraviolet Light-Emitting Diodes and Their Applications Technology," CS Mantech Conference, May 13-16, 2013, p. 41-43. http://csmantech.org/OldSite/Digests/2013/papers/014.pdf.

Kim et al., "Growth and characterization of high quality AlN using combined structure of low temperature buffer and superlattices for applications in the deep ultraviolet," Japanese Journal of Applied Physics, vol. 54, No. 8, p. 081001, 2015.

Mogilatenko, A., et al., "Influence of AlN/(Al,Ga)N superlattices on the defect densities in UV-LEDs formed on high-temperature AlN layers on sapphire," vol. 3: Materials Science 2009, http://www.univie.ac.at/asem/Graz_MC_09/papers/31068.pdf.

Mogilatenko, A., et al., "Investigation of AlN/(Al,Ga)N superlattices grown on high-temperature AlN layers on sapphire by metalorganic vapour phase epitaxy." crysta.physik.hu-berlin.de/~anmog/pdf/AlGaN_poster.pdf.

Nikishin, Sergey A. et al., "Deep Ultraviolet Light Emitting Diodes Based on Short Period Superlattices of AlN/AlGa(In)N," Jpn. J. Appl. Phys. vol. 42 (2003) pp. L1362-L1365, Part 2, No. 11B, Nov. 15, 2003. https://pdfs.semanticscholar.org/b01f/0d5aab3d25494dd1df7bc0dea90f9826adbf.pdf.

Peng et al., "Reducing dislocations of Al-rich AlGaN by combining AlN buffer and AlN/Al 0.8 Ga 0.2 N superlattices," Journal of Crystal Growth, vol. 310, No. 6, pp. 1088-1092, 2008.

Sun, et al., "Fine structure of AlN/AlGaN superlattice grown by pulsed atomic-layer epitaxy for dislocation filtering," Applied Physics Letters, vol. 87, No. 21, 2005.

Wang et al., "AlN/AlGaN superlattices as dislocation filter for low-threading-dislocation thick AlGaN layers on sapphire," Applied Physics Letters, vol. 81, No. 4, pp. 604-606, 2002.

* cited by examiner

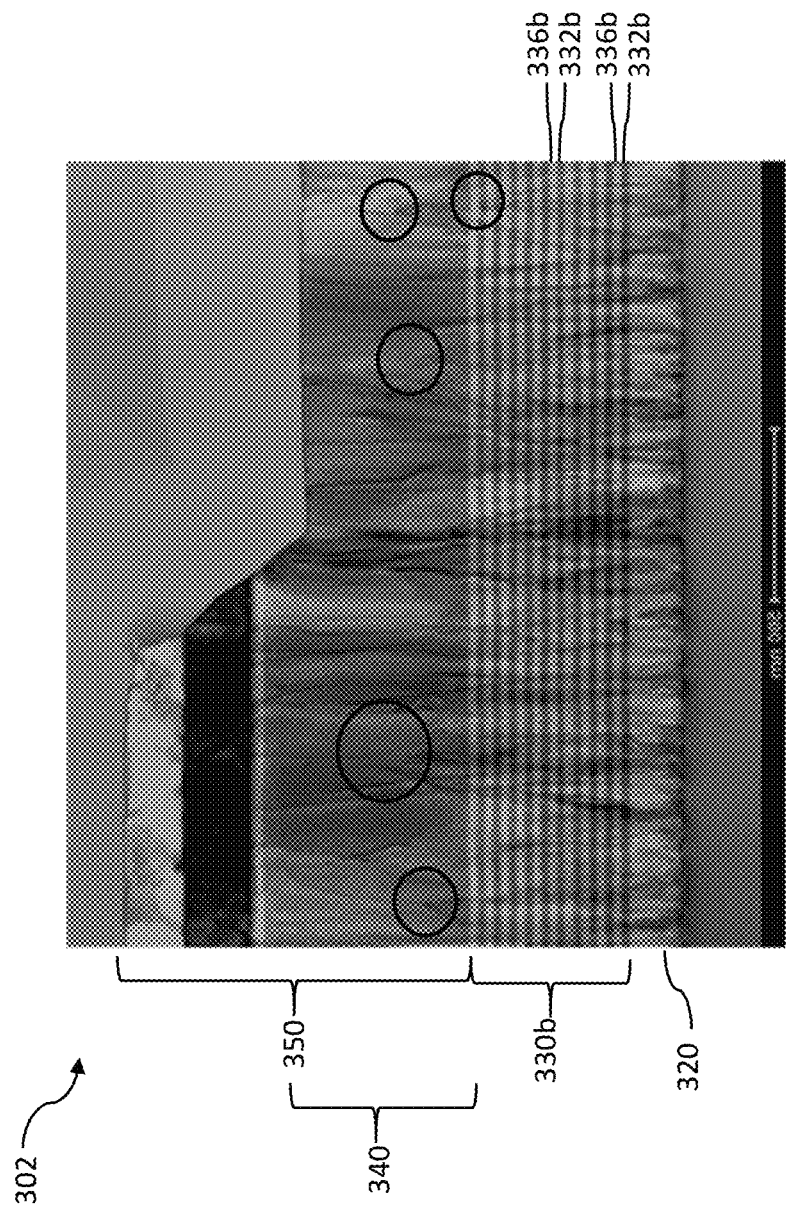

DISLOCATION FILTER FOR SEMICONDUCTOR DEVICES

BACKGROUND

In semiconductor devices, the development of high crystalline structural perfection is necessary for achieving high performance in both electronic and optoelectronic devices. Commercial success of silicon (Si) complementary-metal-oxide semiconductor (CMOS) devices, and quantum mechanical devices based on epitaxial thin film deposition of gallium-arsenide (GaAs) is fundamentally due to availability of low cost and extremely high crystalline perfection bulk substrates of Si and GaAs, respectively.

Less traditional semiconductor materials such as those formed of group III-nitride (III-N) materials offer the potential for expansion in device functionality, particularly for high power electronics and optoelectronic devices such as ultraviolet (UV) light emitting diodes (LEDs) and lasers. Semiconductor optoelectronic devices convert electrical energy into optical energy by taking advantage of the interaction of electrical energy with the semiconductor's crystal structure which has a specific electronic energy configuration known as the electronic band structure. Semiconductor light sources generate light using semiconductor junctions comprising at least a p-type semiconductor region and an n-type semiconductor region. The p-type semiconductor region is designed to be a source of holes, whereas the n-type region is a source of electrons. Under the appropriate external electrical bias, electrons and holes are injected from their respective sources towards an intrinsic layer, which serves as an electron-hole-recombination region. Group III-nitride material is generally the most mature wide bandgap semiconductor material and is widely used in UV and visible LEDs in the wavelength range of 250 to 600 nm.

While epitaxial deposition of sequential and multiple composition thin films of III-N is well-known in the art, the commercial success of III-N devices is still limited by the available substrates that can be used. The commercially available substrates compatible for III-N epitaxial deposition suffer disadvantages such as high production cost, available wafer diameter, lack of crystal structure match to III-N, and lack of surface quality provided by the substrate for epitaxy.

Recently, bulk freestanding and low crystalline defect density GaN and AlN substrates have become commercially available for application in power electronics and optoelectronic device markets. Electronic and optoelectronic III-N devices formed on these high quality bulk GaN and AlN substrates using thin film deposition techniques show high performance, primarily due to the much closer match in crystal structure between epitaxial film and the substrate and the resulting low defect density attained within the active layer films. Unfortunately, the cost of these GaN and AlN substrates hinder widespread use. Additionally, limited available wafer diameters and presence of impurities hinder their use in deep UV.

Due to the lack of availability of large native substrates with suitable transparency at UV wavelengths, III-N epigrowth is typically performed on sapphire, silicon (Si) or silicon carbide (SiC) substrates, all of which have high lattice mismatch to III-N materials such as aluminum nitride (AlN) and aluminum-gallium-nitride (AlGaN). Growth of device stack epilayers on a dissimilar substrate material generates a large number of threading dislocations (e.g., on the order of $10^{10}$ cm$^{-2}$) in the epistack. Threading dislocations are defects which propagate vertically through an epifilm, usually originating at the interface between the substrate and epifilm. The three types of threading dislocations are screw, edge, and mixed. Screw dislocations propagate in a helical pattern perpendicular to the stress direction. Edge dislocations occur when an extra plane of atoms is present within a crystal structure. Mixed defects are intermediate between screw- and edge-type. Threading dislocation density (TDD) in the intrinsic layer of a semiconductor LED device is an important factor in determining the internal quantum efficiency (IQE) and therefore light output intensity of LEDs, as they provide non-radiative recombination sites. The presence of defects also affects other operational parameters, such as leakage currents and lifetime of the device.

Typical solutions for reducing the TDD include growth of very thick layers, lateral overgrowth on patterned substrates, growth on very small lattice mismatched native substrates of AlN or GaN, use of superlattice strain buffer layers, and insertions of a variety of very thin interlayers or masking structures such as $Si_xN_y$ and Ti. Due to difficulties associated with the growth kinetics—such as difficult lateral growth of AlN and long growth times—most of these options are not suitable for molecular beam epitaxy (MBE) grown materials.

SUMMARY

In some embodiments, a dislocation filter for a semiconductor device has a buffer layer comprising a short-period superlattice (SPSL) layer. The SPSL layer has first sub-layers of a first material that alternate with second sub-layers of a second material, the first material and the second material being group III-N binary materials that are different from each other. Each of the first sub-layers and each of the second sub-layers has a sub-layer thickness less than or equal to 12 monolayers. The buffer layer also includes a third layer of a third material, the third material being a group III-N material. The SPSL forms a sandwich structure with the third layer. The buffer layer bends dislocations away from a growth direction of the buffer layer. The dislocation filter also has a transition layer on the buffer layer. The transition layer has a transition layer thickness, where: (i) the transition layer is an SPSL structure, with the transition layer thickness being greater than a thickness of one of the SPSL layers of the buffer layer, or (ii) the transition layer comprises the third material, with the transition layer thickness being greater than a thickness of one of the third layers.

In some embodiments, a semiconductor device has a substrate, a buffer layer on the substrate, a transition layer on the buffer layer, and a device stack on the transition layer. The buffer layer has a plurality of repeating units, each repeating unit having a short-period superlattice (SPSL) layer and an AlN layer. The SPSL layer has alternating sub-layers of AlN and GaN, and each sub-layer has a sub-layer thickness less than or equal to 12 monolayers. The transition layer has a transition layer thickness, where the transition layer thickness is one of: (i) an SPSL structure, with the transition layer thickness being greater than a thickness of each SPSL layer of the buffer layer, or (ii) AlN, with the transition layer thickness being greater than a thickness of each AlN layer of the buffer layer. The transition layer is adjacent to or forms part of the device stack. The buffer layer bends dislocations away from a growth direction of the device stack.

BRIEF DESCRIPTION OF THE DRAWINGS

FIGS. 3A-3B are transmission electron microscopy images of dislocation filter samples, in accordance with some embodiments.

DETAILED DESCRIPTION

Figure 1:
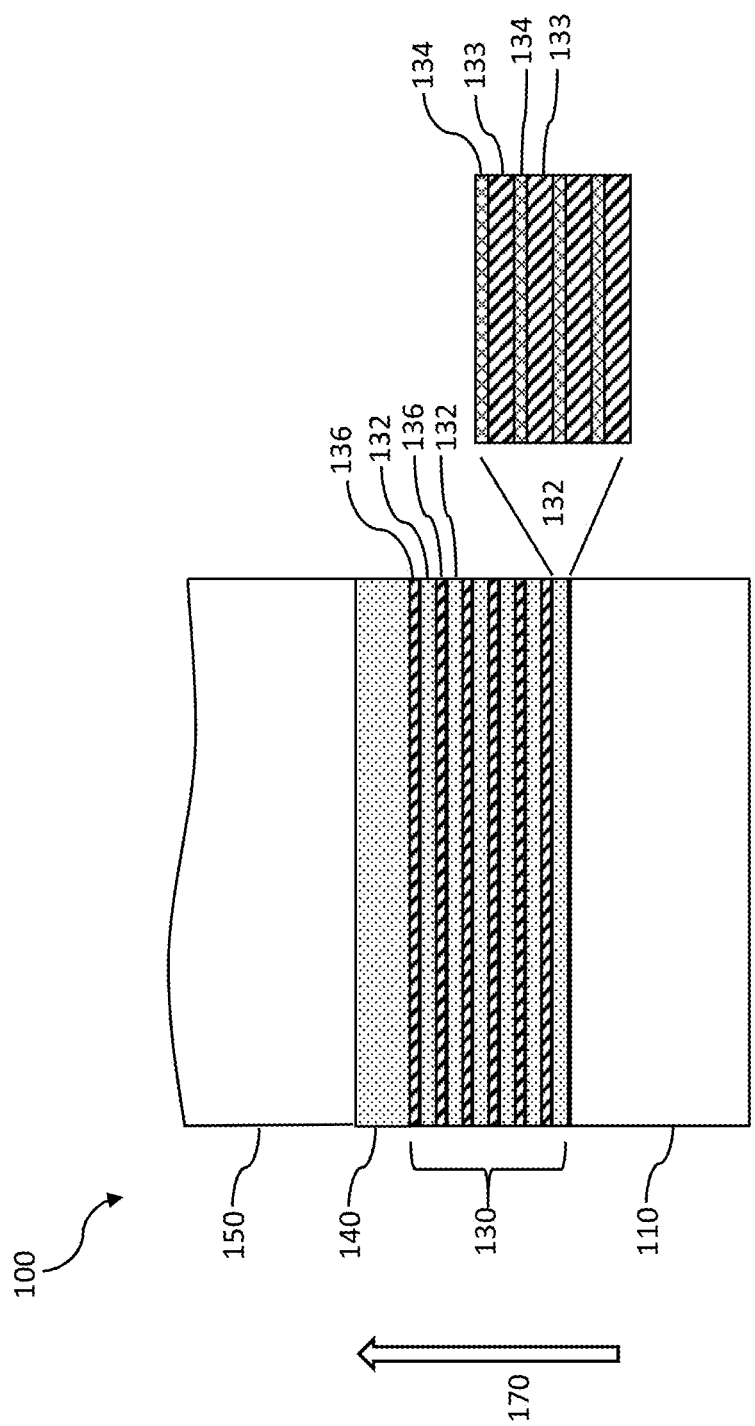
FIG. 1 is a vertical cross-section of a dislocation filter structure, in accordance with some embodiments.

In semiconductor devices, lattice constant mismatch between an epilayer structure and a substrate of material that is dissimilar from the epilayer causes structural crystalline defects known as threading dislocations. In particular, it is well-known that group III-N materials typically cannot be grown ideally on dissimilar substrates having a large difference in crystal lattice constants from the grown layers. The most common technique used commercially to address threading dislocations that arise due to dissimilar substrates is brute force growth of very thick layers. The thick layers have initially highly defective and structurally mismatched III-N films on the substrate, which gradually transform to lower defect density III-N films as a function of growth thickness. For example, bulk AlGaN (e.g., layers of AlGaN with thicknesses on the order of microns) are often used. Superlattice (SL) structures are another area that have been investigated for reducing defects. For example, superlattices with graded composition layers, doping, various compositions of $Al_xGa_{1-x}N$, and layers including other elements such as indium and carbon have been used, where the layer thicknesses are typically on the order of several nanometers or more.

It is known in the art that strain modulation is the key factor in causing dislocations to bend, with the primary 'filtering' mechanism being colliding dislocations that annihilate at least one dislocation of the pair. Formation of dislocation loops which do not propagate into the rest of the device beyond the interface at which they form also plays a role in dislocation reduction. However, conventional bulk and superlattice III-N layers for strain modulation typically remain very thick when grown on silicon or sapphire substrates. Using thick group III-N films has certain disadvantages, such as warping the substrate (thus limiting the substrate diameter that can be used), having a large coefficient of thermal expansion which produces cracking, being high-cost due to thick film epitaxy, suffering high surface roughness, taking a long time to grow, and resulting in a final lattice constant that cannot be used for subsequent optimal III-N growth.

The present embodiments uniquely utilize SPSLs in a buffer layer to serve as a means of modulating strain in semiconductor devices to bend dislocations and reduce defects. The SPSL layers are sufficiently thick to induce partial relaxation of the layers in the SPSL, but are thin enough to prevent complete relaxation. Thus, the buffer layer purposely introduces strain to bend defects away from a growth direction of the buffer layer, by bending the defects at interfaces between the SPSL and the alternate layers of the buffer. Yet the overall buffer layer provides enough thickness to allow the dislocations to collide and reduce the number of dislocations—and ideally, to eliminate all dislocations—prior to reaching the device stack.

The SPSLs of the present embodiments are used to mimic conventional bulk layers such as AlGaN. However, the SPSLs allow modulation of strain within the SPSL layer itself as well as within the buffer layer, and provide more opportunity for formation of dislocation loops in the many additional interfaces of the structure. SPSLs also allow larger design and process windows, as the same composition can be achieved by multiple SPSL designs. For example, a 1:1, 2:2 and 3:3 SPSL are all 50% composition, but will have different growth, optical, electrical and strain properties, allowing significant design and fabrication advantages over an equivalent bulk alloy. The present SPSLs use group III-N materials and have layer thicknesses (measured in the growth direction) that are less than or equal to the critical layer thickness (CLT) for the material on the underlying structure. The CLT is defined as the maximum layer thickness possible for maintaining elastic deformation of the layer crystalline lattice in order to match the in-plane lattice constant of the underlying crystal structure, where the lattice constant perpendicular to the growth direction is defined as the in-plane lattice constant. The CLT for a layer grown on a dissimilar lattice constant material is determined by a thickness where a transition from elastic deformation to irreversible plastic deformation occurs. The CLT is larger in an SPSL than in an equivalent bulk layer.

In some embodiments, the buffer layer utilizes AlN as a layer material that alternates with the SPSL within the buffer. The overall Al content in the SPSL is optimized with layer thicknesses such that the strain modulation is maximized, transparency is maintained and the layer does not fully relax. In comparison, conventional superlattices for reducing dislocations often use GaN as one of the component layers, which relaxes at smaller thickness, and is not transparent. For optical devices such as LEDs, achieving optical transparency in the device layers is extremely important.

The use of SPSLs (i.e., with layer thicknesses up to approximately 12 monolayers (ML)) rather than bulk III-N layers or conventional superlattices (i.e., with layer thicknesses greater than 2 nm) enables benefits such as higher CLT for the same effective composition, increased formation of dislocation loops, increased number of interfaces for dislocation bending and a smoother growth surface. However, difficulty in producing high quality SPSLs in the III-N system (especially by MOCVD which is the favored growth mode due to a larger growth rate) has resulted in these advantages being overlooked. Strain behavior of SPSLs is also not well understood or documented in the industry. Thus, the use of SPSLs for strain modulation is counterintuitive.

In the present embodiments, the thin SPSL layers can be grown with a variety of methods, such as with molecular beam epitaxy (MBE) or metal organic chemical vapor deposition (MOCVD) rather than primarily MOCVD as is used conventionally for semiconductor layers. In some embodiments, MBE can be used to help ensure thin films (e.g. 1 ML) of sufficient quality.

FIG. 1 is a vertical cross-sectional view of a semiconductor device 100 with a dislocation filter in the form of a buffer layer 130, in accordance with some embodiments. Device 100 has a substrate 110, with the buffer layer 130 on the substrate 110. Example materials for substrate 110 include sapphire, silicon, SiC, AlN, AlGaN, GaN, various oxides such as ZnO and MgO and nitrides such as BN. A transition layer 140 is on the buffer layer 130, followed a device stack 150. Device stack 150 can include, for example, an n-type layer of an LED, an intrinsic layer and p-type layer.

Buffer layer 130 uses SPSLs 132 having first and second sub-layers 133 and 134, where the SPSL 132 alternates with another (third) layer 136 to form a superlattice (SL) that serves as a dislocation filter. The dislocation filter formed by buffer layer 130 bends dislocations away from a growth direction 170 of the device 100 such that instead of propagating vertically, the dislocations collide with each other and become eliminated. The SPSL layer 132 forms a sandwich structure with the third layer 136, and the SPSL layer 132 and the third layer 136 form a repeating unit of the buffer layer 130. In some embodiments, either the first and second sub-layers 133 or 134 can be the same material as third layer 136.

The SPSL layers 132 of buffer layer 130 are made of sub-layers 133 and 134. The first sub-layer 133 of SPSL layer 132 is made of a first material, and second sub-layer 134 is made of a second material, where the first material and the second material are group III-N binary materials that are different from each other. Each of the first sub-layers 133 and each of the second sub-layers 134 has a sub-layer thickness less than a critical layer thickness of the material, such as being less than 4, 8, 10 or 12 monolayers. For example, the CLT for AlN on relaxed GaN or GaN on relaxed AlN can be approximately 4-12 monolayers (approximately 30 Å). The third layer 136 of the SL buffer layer is a third material, being a group III-N material. The third material can be a binary material such as AlN, or a ternary material such as AlGaN or InGaN. In some embodiments, the third layer 136 is also an SPSL of different composition from layers 132.

Transition layer 140 can be the same material as either the SPSL 132 or third layer 136 of the buffer layer 130, or a different material from both SPSL 132 and third layer 136, but of a greater thickness than in the buffer layer 130 to allow any remaining dislocations to collide and become annihilated. The thickness of layers in the present embodiments is defined as the thickness in the growth direction 170. In the embodiment shown in FIG. 1, transition layer 140 is an SPSL structure of the same composition as SPSL layer 132, but having a transition layer thickness greater than a thickness of one of the SPSL layers 132 of the buffer layer 130. In other embodiments, the transition layer 140 can be made of the third material—the same as third layer 136—with a transition layer thickness greater than one of the third layers 136. The material for transition layer 140 can be the same or different than the last layer of buffer layer 130 (highest layer of buffer layer 130 in FIG. 1). For example, if the last layer of buffer layer 130 is an SPSL layer 132, the transition layer 140 can be made of either the third material or the SPSL composition.

Figure 2:
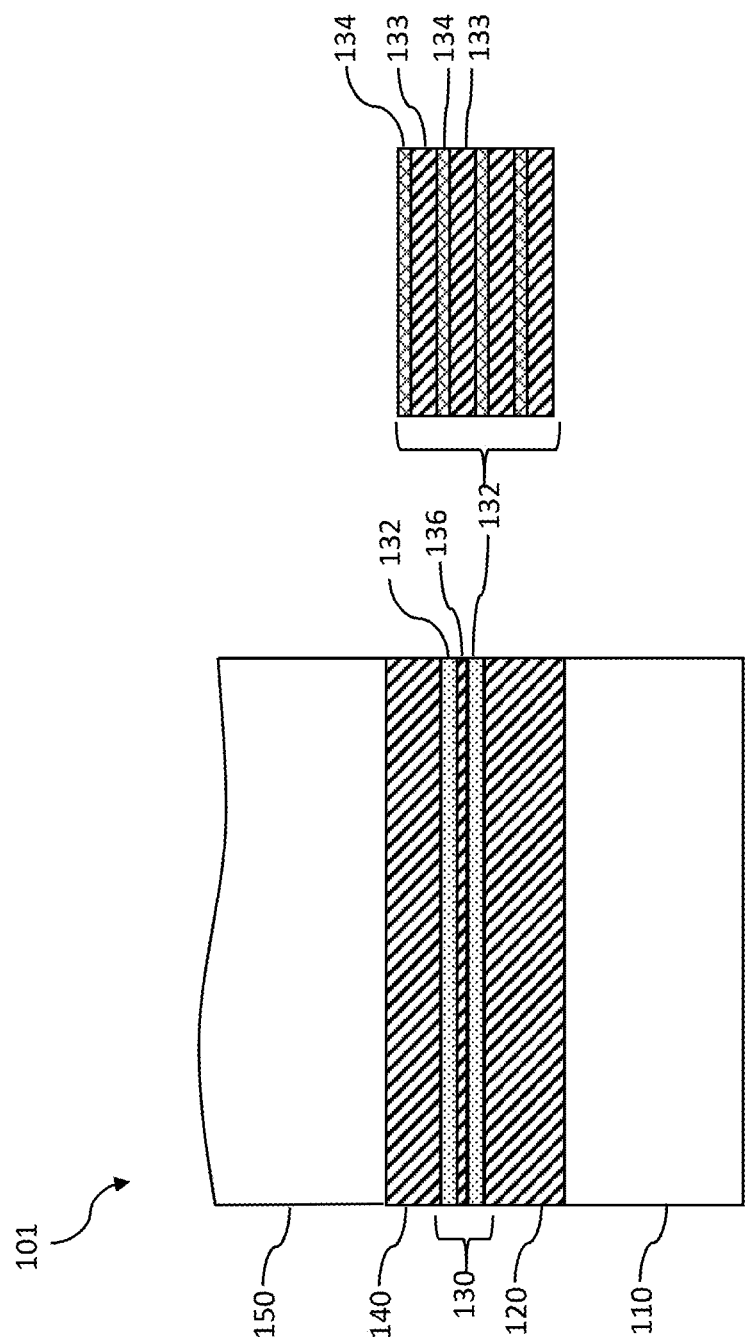
FIG. 2 is a vertical cross-section of a dislocation filter structure, in accordance with further embodiments.

FIG. 2 is another embodiment of a device 101 having a buffer layer 130 that serves as a dislocation filter. FIG. 2 is similar to FIG. 1, but with a nucleation layer 120 included between the substrate 110 and buffer layer 130. The nucleation layer 120 can assist in growth of the buffer layer 130, although the presence of a nucleation layer is not required. Having an initial, thick nucleation layer of a single material can reduce the time to grow the total thickness needed for the buffer layer, compared to growing the same thickness with an SPSL. In some embodiments, the nucleation layer can be used to reduce the number of initial defects in the device stack. In this embodiment of FIG. 2, the nucleation layer 120 is made of the same material as first sub-layer 133. FIG. 2 also illustrates the use of fewer repeating layers in the buffer layer 130 compared to FIG. 1, with 1.5 repeats of the SPSL layer 132 and third layer 136. However, SPSL layer 132 still forms a sandwich structure with the third layer 136.

In this embodiment, the transition layer 140 is the same material as third layer 136. In an example embodiment of device 101, substrate 110 is sapphire, nucleation layer 120 is AlN, SPSL first sub-layer 133 is AlN, SPSL second sub-layer 134 is GaN, third layer 136 is AlN, and transition layer 140 is AlN. The inclusion or omittance of a nucleation layer will depend on factors such as the substrate material being used.

Materials for nucleation layer 120, in embodiments where a nucleation layer is inserted between the substrate 110 and buffer layer 130, include AlN, AlGaN, GaN or an SPSL comprising one or more of AlN, AlGaN and GaN. The nucleation layer 120 can also be a graded layer of any of these materials. The nucleation layer can have a thickness in a range of, for example, 50 nm up to 5 μm if formed by MBE, or 50 nm up to 10 μm for MOCVD. For example, in some embodiments, the nucleation layer thickness may be between 150-250 nm.

In some embodiments, the buffer layer 130 having the SPSL layer 132 does not need to be located adjacent to the substrate 110 or nucleation layer 120. That is, the buffer layer 130 can be placed at other locations between the substrate 110 and the active regions (electrical or optical) of the device 100.

Figure 3A:
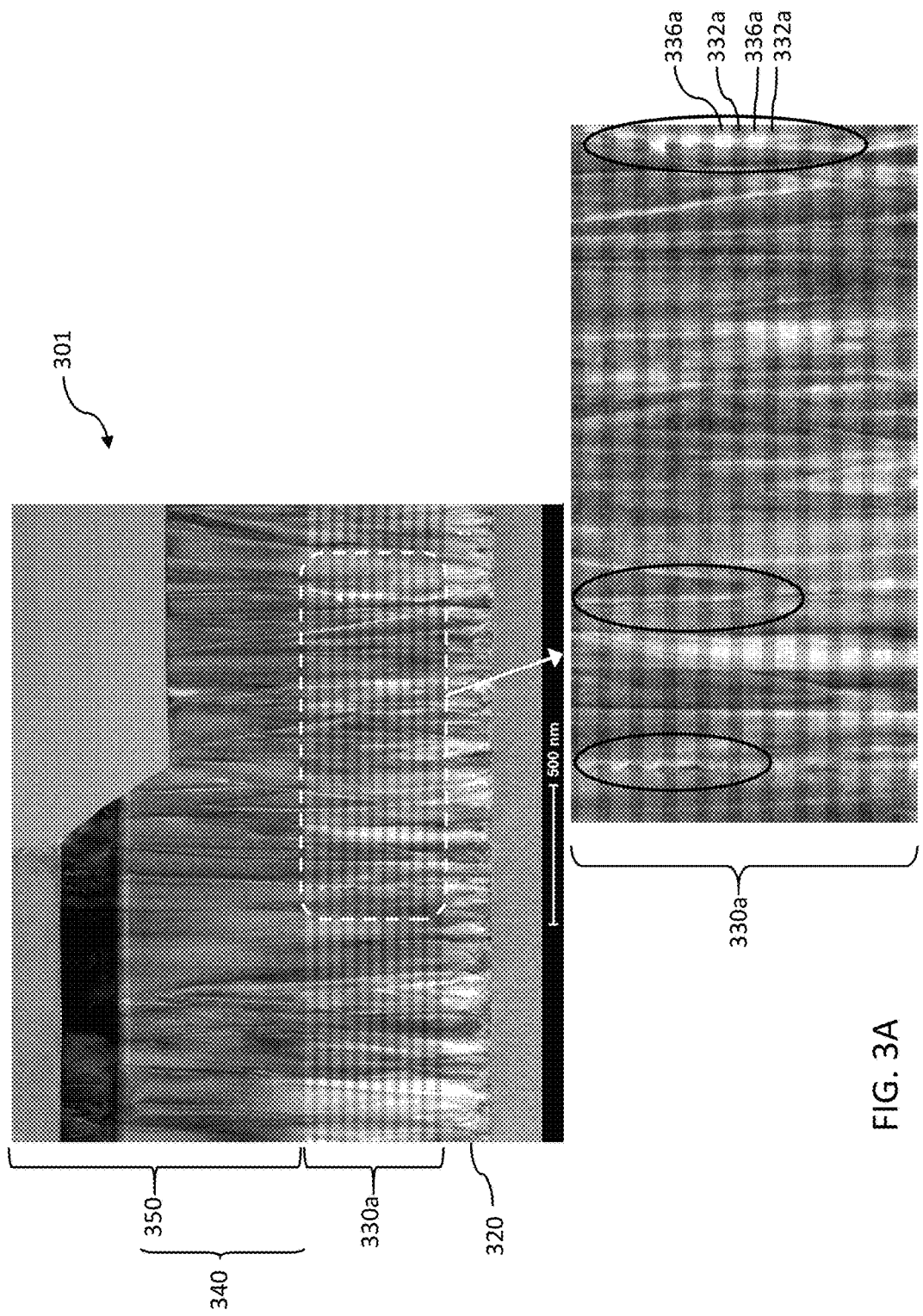

FIGS. 3A-3B show transmission electron microscopy (TEM) images of example dislocation filter buffers in which SPSLs are used. The dislocation lines can be identified by contrast difference in the images, where in FIG. 3A the bottom image is a higher magnification view than the top image. Sample 301 of FIG. 3A and sample 302 of FIG. 3B both had a sapphire substrate 310, and 200 nm of AlN as a nucleation layer 320 grown at 880° C. prior to the buffer layer 330a/b. Transition layer 340 in this sample was part of the device stack 350. The samples 301 and 302 also had a conventional device stack 350 involving 190 nm thickness of a p-type SPSL, 50 nm of a chirped SPSL, 50 nm of an intrinsic layer SPSL ("i-SPSL"), and 600 nm of an n-type SPSL. In both samples 301 and 302, the buffer layer 330a/b had SPSL layers 332a/b of 25 nm thickness alternating with AlN layers 336a/b of 25 nm thickness. Ten repeats of the SPSL layers 332a/b and AlN layers 336a/b were used. The SPSL layers 332a/b were made of GaN and AlN sub-layers, where the ratio of GaN to AlN monolayers was 1:4. In sample 301 the AlN layer 336a was doped, whereas in sample 302 the AlN layer 336b was undoped.

Dislocations are clearly observed to bend at interfaces between AlN layers 336a and SPSL layers 332a within the buffer layer 330a, as can be seen in the circled areas in the bottom image of FIG. 3A. Also, annihilation of bent dislocations was observed in many instances, as shown in the circled areas of FIG. 3B.

Figure 3C:
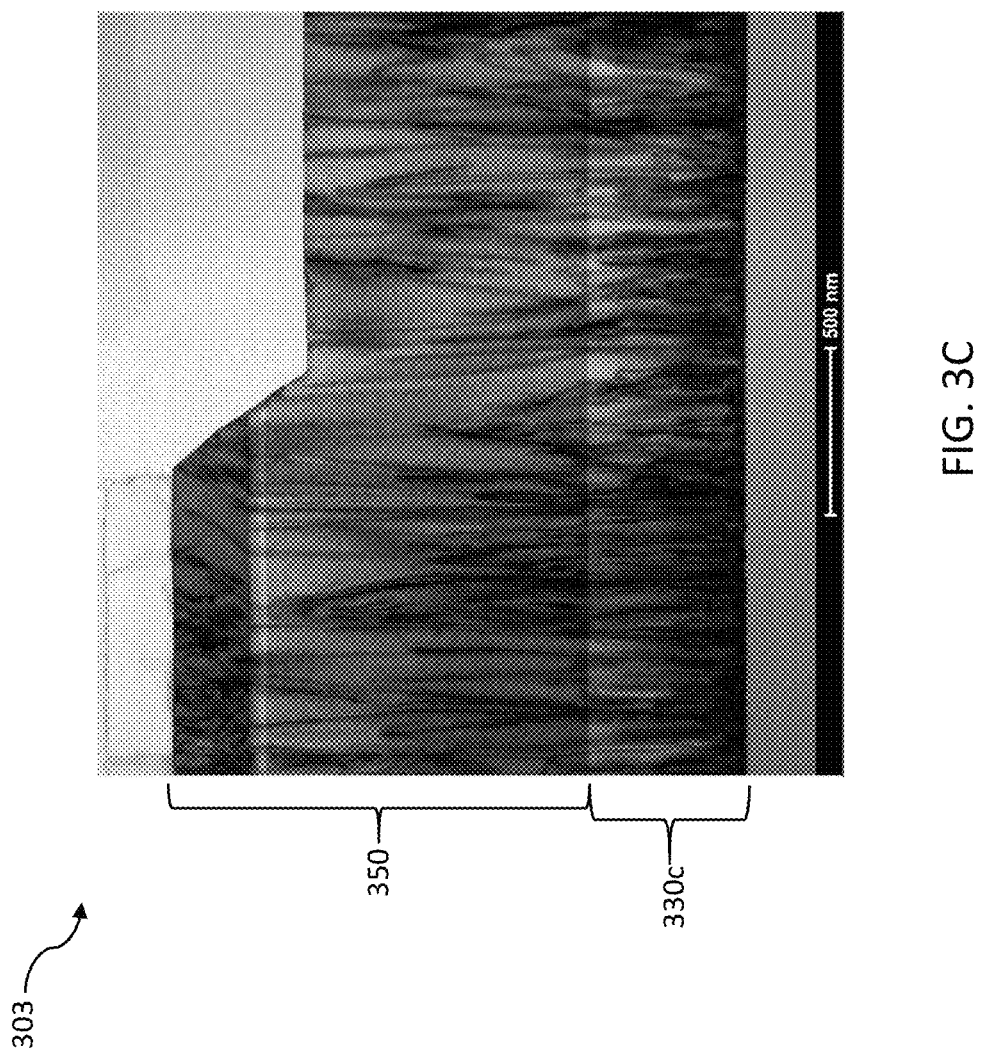
FIG. 3C is a transmission electron microscopy image of dislocation defects in a conventional semiconductor device.

Table 1 below shows the factor of reduction in the number of defects from the top of the buffer 330a/b to the top of the i-SPSL layer in device stack 350. Measurements were taken across a one micron length at a fixed location below the mesa. The first number in the defect reduction column represents the reduction in edge dislocations, and the second number represents the reduction in screw dislocations. The reference sample 303 corresponds to the sample shown in FIG. 3C, in which no dislocation SPSL buffer was used. Instead, sample 303 had an AlN layer within layer 330c with the same thickness as the total thickness of the third layer 336a/b components of buffer layers 330a/b in samples 301 and 302. Sample 303 also had an n-SPSL layer within layer 330c that had a thickness to match the total thickness of layers 332a/b of samples 301 and 302. In this way, the effect of dislocation reduction throughout the thickness of the growth is examined independently of the dislocation filter structure, acting as a reference. A device stack 350 comprising an n-SPSL, 50 nm i-SPSL, 50 nm chirped SPSL and 190 nm p-SPSL is grown on the AlN buffer 330c.

TABLE 1

Factor of reduction in defects from top of buffer to top of i-SPSL

| Sample | Defect Reduction (edge/screw) |
|---|---|
| Reference sample 303 | 2/2.21 |
| Sample 301 | 3.22/2.17 |
| Sample 302 | 2.28/2.33 |

The reference sample 303 had a reduction of approximately 2× from the AlN layer 330c to the top of the i-SPSL layer. Sample 301 had a reduction of approximately 3×, showing the ability for the SPSL-type buffer layer of the present embodiments to function as a dislocation filter. These experimental results using a symmetric design of the buffer superlattice in samples 301 and 302 (i.e., layers 332a/b being the same thickness as layers 336a/b) could be further optimized for bending by using asymmetric thicknesses.

In the present embodiments, the layers of the dislocation filter can have a range of compositions and thicknesses, depending on the specifications of the device being formed. In particular, the materials and thicknesses of the layers within dislocation filter buffer layer will impact the strain modulation. The design goal is to maximize strain contrast by maximizing composition difference in the layers of the buffer layer and growing them thicker. However, larger strain contrast means that a layer must be grown thinner to prevent relaxing, and this trade-off must be considered in the design of the buffer layer. Manufacturing aspects such as growth rates can also be a factor in deciding layer thicknesses, as SPSLs can require more time to grow than single material layers. Furthermore, different configurations of the layers within the dislocation filter can be designed to balance factors such as the number of interfaces for achieving a desired amount of bending, and the amount of thickness to provide sufficient distance for dislocations to annihilate.

The target wavelength for an LED device and the needed optical transparency can also affect the designed compositions of materials and layer thicknesses. For example, increasing strain contrast by pushing the lattice constant towards GaN makes the layers less transparent to low wavelengths. Increasing the thickness of partially absorbing layers will also reduce transparency. Consequently, the exact configuration for a device will be largely dependent on the wavelength for which the device is being designed. For devices that are not for light emitting applications, factors other than light transparency considerations should be accounted for.

The layers within the buffer layer may be asymmetric, where the SPSL layer (e.g., SPSL layer 132 of FIG. 1) and its alternating layer (e.g., third layer 136 of FIG. 1) have different thicknesses. This is desirable, as the direction of strain change will impact the direction in which dislocations bend, such that the net angle of dislocation bending will be close to zero if symmetric layer thicknesses are used. In asymmetric configurations, the SPSL layer can also provide a certain amount of bending of the dislocations, while the alternating layer can provide space for the dislocations to propagate. In some embodiments, the thickness of the third layer 136 is at least 5 times greater than the thickness of the SPSL layer 132. For example, the third layer 136 can be 10 times, or up to 1000 times thicker than SPSL layer 132 using MBE, or up to 5000× thicker using MOCVD.

In further embodiments, the buffer layer 130 and the transition layer 140 are repeated, forming another superlattice. Such a configuration allows sequential reduction of dislocations by allowing bent dislocations to propagate and annihilate before introducing further dislocation bending. For example, the device 100 can have a superlattice structured as $((SPSL/AlN)_n/\text{transition layer})_m$, where SPSL is SPSL 132, AlN is the third layer 136, transition layer is the transition layer 140, n is the number of repeating units in buffer layer 130, and m is the number of repeats of the buffer layer 130 and the transition layer 140.

In an example embodiment of FIG. 1 or 2, the substrate 110 is silicon or sapphire, the nucleation layer 120 (which may or may not be included) is made of AlN, the first material of first sub-layer 133 is AlN, the second material of second sub-layer 134 is GaN, and the third material of third layer 136 is AlN. Each sub-layer 133 and 134 has a sub-layer thickness less than or equal to 12 monolayers. For example, the first sub-layer 133 may be 1 to 12 monolayers, such as up to 4, 8, 10 or 12 monolayers; and the second sub-layer 134 may be 1 to 12 monolayers or less, such as up to 4, 8, 10 or 12 monolayers. The transition layer 140 is either i) an SPSL structure of AlN and GaN—the same materials as SPSL 132 but of a greater thickness than SPSL 132—or ii) a non-SPSL layer of AlN but of a greater thickness than third layer 136. The device stack 150 includes the active layers for the device, such as n-i-p layers for an LED. The transition layer 140 is adjacent to or can form part of the device stack as in sample 301 and 302. The thickness of the n-type layer in the device stack 150 should be sufficiently thick that the bent dislocations are allowed to annihilate prior to reaching the intrinsic layer of the device.

In some embodiments of the configuration in the preceding paragraph, the AlN second sub-layers 134 in the SPSL layer 132 comprise greater than 50% composition of the SPSL layer 132. In other embodiments, the composition can be specified by monolayers, where a monolayer ratio of the GaN first sub-layers 133 to the AlN second sub-layers 134 in the SPSL layer 132 can range from 0:10 to 10:0, such as 1:4, and such as including fractional amounts. In some embodiments, the thickness of each of the AlN third layers 136 is at least 5 times greater than the thickness of each of the SPSL layers 132. Greater amounts of AlN can be beneficial to the optical transparency of the device, may be more easily grown than SPSLs and can be exploited to allow dislocations to collide before growing the transition layer. In the case of higher wavelength emission or non-optical devices, higher GaN content may allow more accumulation of strain and a higher degree of bending.

In some embodiments, the buffer layer 130 has 2 to 100 periods of the repeating units (SPSL layer 132 with third layer 136), and each SPSL layer 132 has an SPSL thickness of 1 nm to 100 nm. For example, the buffer layer 130 may have 20 to 30 periods of the repeating units, and the thickness of each SPSL layer 132 is 10 nm to 25 nm. Such embodiments may typically be used when SPSL layer 132 has high Al-content due to strict transparency requirements in optical devices. In order to achieve the desired dislocation bending and reduction, many repeats of thicker layers may be required to achieve an accumulative effect.

In another example embodiment of the devices of FIG. 1 or 2, the first and second sub-layers 133 and 134 are AlN and GaN, respectively, and the third layer 136 is AlN. The nucleation layer 120 has a nucleation layer thickness of 150-250 nm, the buffer layer 130 has 5 to 10 periods of the repeating units (SPSL layer 132 and third layer 136), the thickness of each SPSL layer 132 is 8 nm to 12 nm, and the thickness of each AlN third layer 136 of the buffer layer is 90 nm to 110 nm. Such designs prioritize the collision of bent dislocations, such as in the case where optical transparency at low wavelengths is not required and bending angles can be achieved with low Al-content SPSLs.

In another example embodiment of the devices of FIG. 1 or 2, the sub-layers 133 and 134 are AlN and GaN, respectively, and the third layer 136 is AlN. The device 100 includes a nucleation layer 120 having a nucleation layer thickness of 150-250 nm, the buffer layer 130 has a buffer layer thickness of 0.5 µm to 2 µm, and the transition layer 140 has a transition layer thickness of 0.5 µm to 1.5 µm. For example, a total thickness of the nucleation layer and buffer layer and transition layer can range from 50 nm to approximately 10 µm (or greater than 10 µm for MOCVD), such as total thicknesses of 1.5-2.1 µm. In some embodiments, the buffer layer can be up to approximately 5 µm thick. The transition layer can also have a thickness of up to approximately 5 µm.

In other embodiments, the thickness of each SPSL layer 132 is 1-50 nm, and the thickness of each AlN third layer 136 is 100-200 nm. In further embodiments, the thickness of each SPSL layer 132 may range from 1 nm to 1 µm. In yet other embodiments, the thickness of each AlN third layer 136 may range from 1 nm to 1 µm if formed by MBE, or 1 nm to 5 µm if formed by MOCVD.

In some embodiments, the buffer layer comprises doping in one or more of the AlN layers, the AlN sub-layers of the SPSL, and the GaN sub-layers of the SPSL. The layers can be doped using silicon or other known methods, such as delta doping. For example, in some embodiments the SPSL layers of the buffer layer are n-doped, and the transition layer is n-doped and is part of an n-region of the device stack. Addition of dopants are known to affect the lattice constant of III-N materials, and this relationship can be exploited to enhance the strain modulation, for example by achieving a higher level of strain difference between layers while maintaining optical transparency.

In some embodiments, any of the layers of the dislocation filter can be graded, in which a composition or thickness of the layer varies in the growth direction of the device (i.e., in the vertical direction if FIGS. 1 and 2). For example, the SPSL layer 132 can vary in composition through the buffer layer 130, and/or the thickness of the SPSL layer 132 within each period can be graded. Similarly, the thickness of the third layer 136 within each period can be graded. In other embodiments, the transition layer 140 can have a graded composition.

Figure 4:
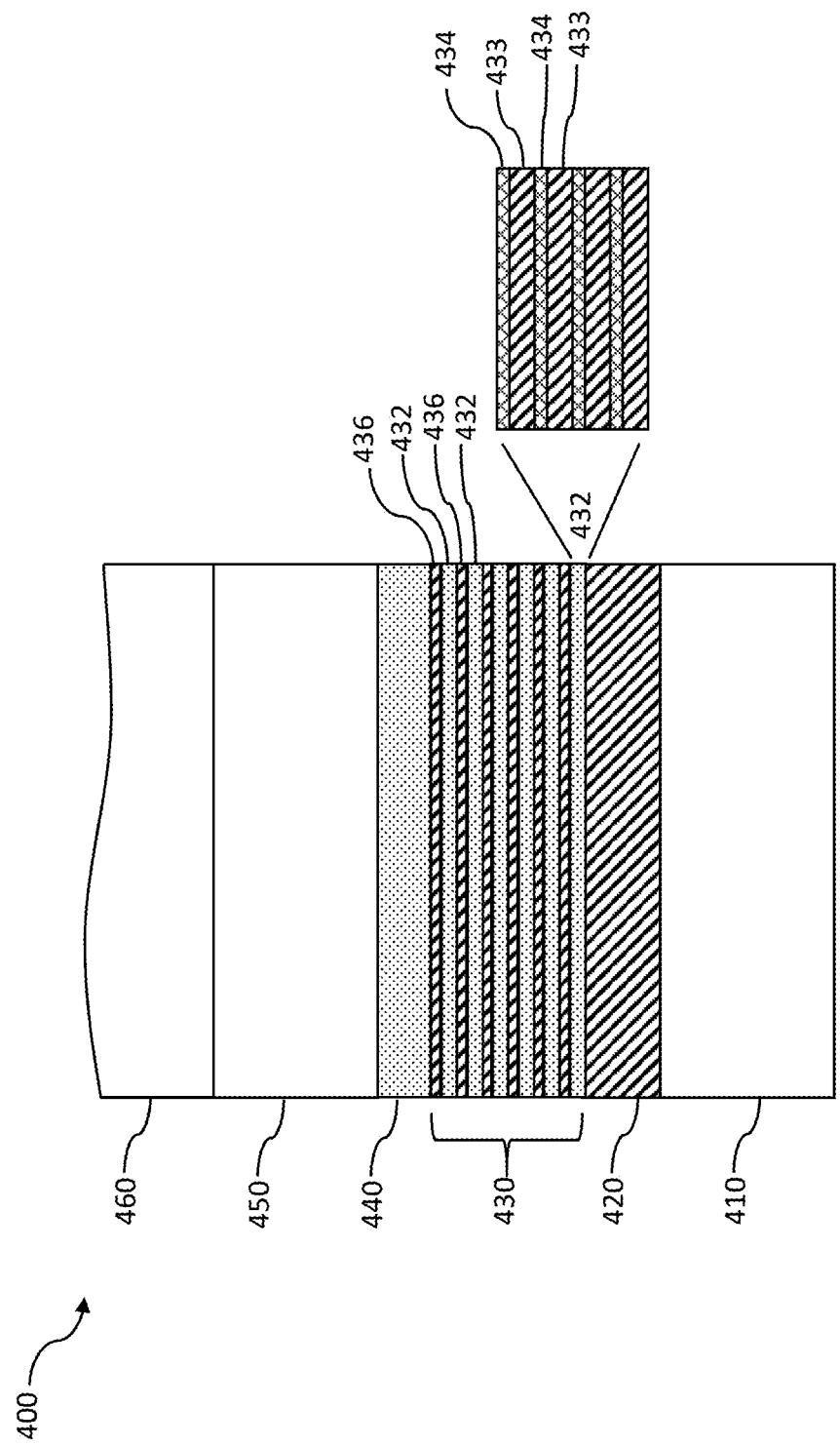
FIG. 4 is a vertical cross-section of a semiconductor device having a dislocation filter structure, in accordance with some embodiments

FIG. 4 shows an embodiment in which the semiconductor device 400 is an LED. The substrate 410 is sapphire, and the nucleation layer 420 (which is optional) is made of AlN. In buffer layer 430 the first material of first sub-layer 433 is AlN, the second material of second sub-layer 434 is GaN, and the third material of third layer 436 is AlN. Each sub-layer 433 and 434 of SPSL 432 has a sub-layer thickness less than or equal to 12 monolayers. For example, the AlN first sub-layer 433 may be up to 4, 8, 10 or 12 monolayers; and the GaN second sub-layer 434 may be up to 4, 8, 10 or 12 monolayers. The transition layer 440 is either an SPSL structure of AlN and GaN—the same materials as SPSL 432 but of a greater thickness than SPSL 432—or the transition layer 440 can be AlN but of a greater thickness than third layer 436. The device stack includes first device layer 450 and remaining device stack 460, where the transition layer 440 is adjacent to or forms part of the device stack. The first device layer 450 may be an n-SPSL of the same materials as in SPSL layer 432. In some embodiments, the substrate 410 for the LED device 400 is sapphire, and the device layer 450 and device stack 460 comprises AlN and GaN.

In some embodiments of FIG. 4, the LED device 400 has a target wavelength of less than 300 nm. In one example, the device stack is a n-i-c-p-stack where the n-type layer 450 is an SPSL of AlN and GaN. The remaining device stack 460 includes a chirped layer which is an SPSL of AlN and GaN and having a composition graded between 100% AlN and 0-50% AlN; and the p-layer can be p-GaN or p-SPSL.

The present embodiments can also be used to fabricate other types of nitride-based semiconductor devices, such as high electron mobility transistors (HEMTs), field effect transistors (FETs), microelectromechanical systems (MEMS), lasers, photodetectors and solar cells. Device stack materials that can be used with the present dislocation filters include any group III-nitrides, including binary compositions (e.g., AlN, GaN, InN) and all ternary and quaternary compositions of those (e.g., InAlGaN, InGaN, AlGaN).

Figure 5:
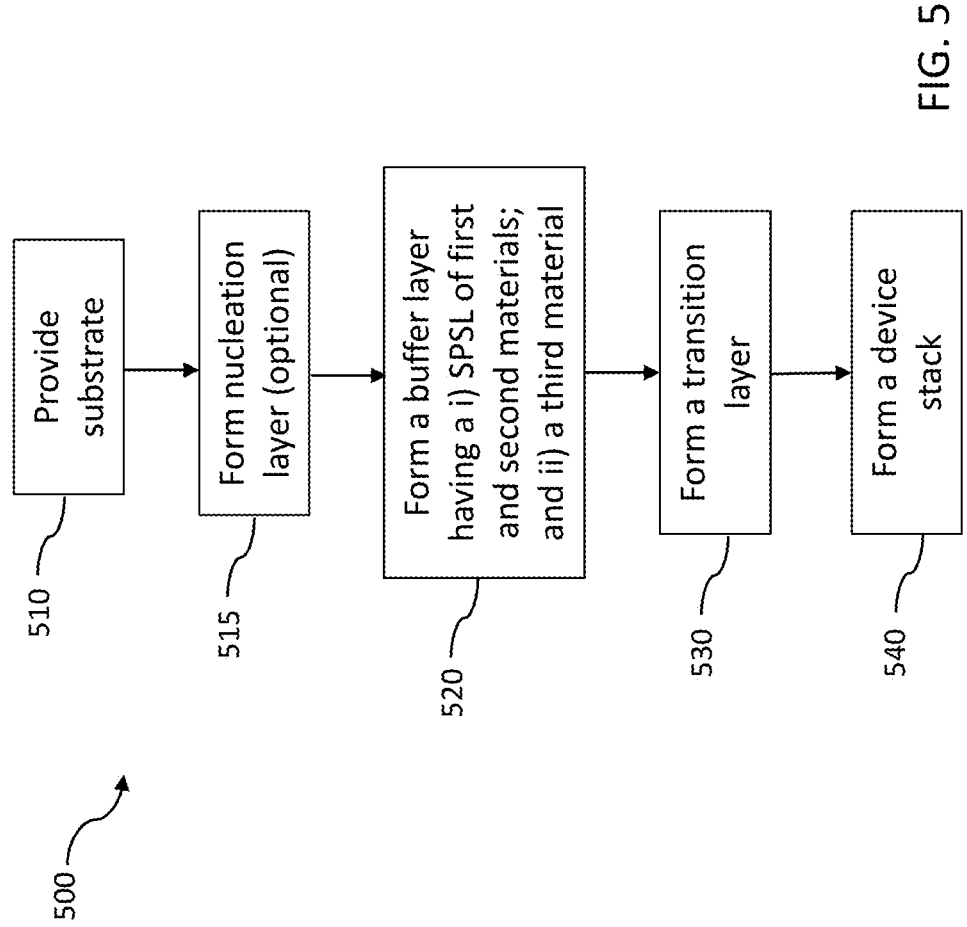
FIG. 5 is a flowchart of methods for forming a dislocation filter structure, in accordance with some embodiments.

FIG. 5 is a flowchart 500 of a method of manufacturing a semiconductor device in accordance with the present embodiments. The method includes providing a substrate in step 510, and forming a buffer layer on the substrate in step 520. The buffer layer (e.g., buffer layer 130 of FIG. 1) includes an SPSL layer (e.g., SPSL layer 132 of FIG. 1) having first sub-layers (e.g., first sub-layer 133 of FIG. 1) of a first material that alternate with second sub-layers (e.g., second sub-layer 134 of FIG. 1) of a second material. The first material and the second material are group III-N binary materials that are different from each other, and each of the first sub-layers and the second sub-layers has a sub-layer thickness less than or equal to 12 monolayers. The SPSL layer bends dislocations away from a growth direction of the buffer layer. The buffer layer also includes a third layer (e.g., third layer 136 of FIG. 1) of a third material, the third material being a group III-N material. The third layer allows dislocations to advance toward each other so that they can cancel each other. The SPSL forms a sandwich structure with the third layer. Step 530 of the method involves forming a transition layer (e.g., transition layer 140 of FIG. 1) on the buffer layer. The transition layer has a transition layer thickness, where: (i) the transition layer is an SPSL structure, with the transition layer thickness being greater than a thickness of one of the SPSL layers of the buffer layer, or (ii) the transition layer comprises the third material, with the transition layer thickness being greater than a thickness of one of the third layers. Step 540 involves forming a device stack, where the transition layer is adjacent to or forms part of the device stack. The buffer layer bends dislocations away from a growth direction of the device stack.

In some embodiments of the method 500, the buffer layer formed in step 520 comprises a plurality of repeating units, each repeating unit consisting of one of the SPSL layers and one of the third layers. In some embodiments, the first material is AlN, the second material is GaN, and the third material is AlN.

To fabricate the layers and devices of the present embodiments, a substrate is provided in a reaction chamber configured for thin film deposition, such as an ultra-high vacuum chamber for use with MBE. Alternative deposition methods such as MOCVD and HVPE may also be used. In some embodiments, a nucleation layer (e.g., nucleation layer 420 in FIG. 4) of AlN is formed adjacent to the substrate by heating the substrate to a growth temperature between 800° C. and 1100° C. Active nitrogen ($N_2$) is supplied by means of a plasma unit, and metal is supplied by heating an effusion cell to obtain a beam equivalent pressure such that 70% to 130% film stoichiometry is obtained. In some embodiments, $N_2$ is supplied by means of a nitrogen precursor gas and cracker. In some embodiments, group-III flux and $N_2$ are supplied constantly. In some cases, one or both fluxes may be pulsed with constant or varying periods. Growth of the nucleation layer is continued such that a total desired thickness is achieved. In some embodiments, this total thickness is 80 nm to 220 nm. Substrate temperature is then reduced to 700-850° C.

An SPSL layer is formed by sequential shuttering of differing metal effusion cells (e.g. Ga and Al) with a constant supply of $N_2$. Effusion cells are temperature controlled such that the deposition rate of GaN and AlN allow sufficient thickness control and sharp interfaces are obtained. Shutter timings are selected such that the desired ratio of SPSL sub-layers (e.g. GaN and AlN) is obtained, such as 1:4 GaN:AlN. This shuttering sequence is repeated until the total thickness of the SPSL layer reaches a desired layer thickness, in some embodiments 5 nm to 50 nm. Substrate temperature may be maintained at a temperature optimized for SPSL growth, or changed to be optimized for AlN. An AlN layer is then formed in the same manner as the nucleation layer and SPSL sub-layer. In some embodiments, process parameters such as metal flux, shutter sequence or $N_2$ flux may be changed to influence the properties of the AlN layer such that it is significantly different from the SPSL sub-layer. AlN is grown until the desired thickness is obtained. The entire sequence of SPSL and AlN growth is repeated until the desired number of periods is obtained.

In some embodiments, each of the SPSL layers and each of the third layers are formed at 800-850 C. For example, forming of the buffer layer in step 520 may be performed using molecular beam epitaxy, at a temperature of 600-1100 C; or forming of the buffer layer in step 520 may be performed using metal organic chemical vapor deposition, at a temperature of 600-1500 C. In general, MOCVD can provide faster growth for non-SPSL layers (e.g., third layer 136 of a single material). MBE typically will provide better control for the SPSL layers and may be required to achieve high quality layers less than a few ML thick. In some embodiments, the buffer layer is grown in its entirety under conditions optimized for the SPSL layer, such as reduced temperature with respect to the buffer layer to prevent out-diffusion of GaN during the SPSL growth. In some embodiments, substrate temperature may be modulated with the layer growth such that optimized conditions are utilized for SPSL layer 132 and the third layer 136. Growth of the buffer can also include doping with silicon or other techniques.

In some embodiments, the method 500 may also include a step 515 of forming a nucleation layer between the substrate and the buffer layer. In some embodiments of the method 500, the forming of the buffer layer in step 520 comprises doping one or more of: the first sub-layers of the SPSL, the second sub-layers of the SPSL, and the third layer.

Reference has been made in detail to embodiments of the disclosed invention, one or more examples of which have been illustrated in the accompanying figures. Each example has been provided by way of explanation of the present technology, not as a limitation of the present technology. In fact, while the specification has been described in detail with respect to specific embodiments of the invention, it will be appreciated that those skilled in the art, upon attaining an understanding of the foregoing, may readily conceive of alterations to, variations of, and equivalents to these embodiments. For instance, features illustrated or described as part of one embodiment may be used with another embodiment to yield a still further embodiment. Thus, it is intended that the present subject matter covers all such modifications and variations within the scope of the appended claims and their equivalents. These and other modifications and variations to the present invention may be practiced by those of ordinary skill in the art, without departing from the scope of the present invention, which is more particularly set forth in the appended claims. Furthermore, those of ordinary skill in the art will appreciate that the foregoing description is by way of example only, and is not intended to limit the invention.

What is claimed is:

1. A semiconductor device comprising:
a buffer layer comprising:
a short period superlattice (SPSL) layer having first sub layers of a first material that alternate with second sub-layers of a second material, the first material and the second material being group III-N binary materials that are different from each other, wherein each of the first sub-layers and each of the second sub-layers has a sub-layer thickness greater than zero and less than or equal to 12 monolayers; and
a third layer of a third material, the third material being a single layer of a group III-N material and having a thickness equal to or greater than the SPSL layer;
wherein the SPSL layer forms a sandwich structure with the third layer;
wherein the buffer layer bends dislocations away from a growth direction of the buffer layer; and
a transition layer on the buffer layer, the transition layer having a transition layer thickness, wherein: (i) the transition layer is an SPSL structure, with the transition layer thickness being greater than a thickness of one of the SPSL layers of the buffer layer, or (ii) the transition layer comprises the third material, with the transition layer thickness being greater than a thickness of the third layer.

2. The semiconductor device of claim 1, wherein the buffer layer comprises a plurality of repeating units, a plurality of SPSL layers, and a plurality of third layers, each repeating unit consisting of one of the plurality of SPSL layers and one of the plurality of third layers.

3. The semiconductor device of claim 1, wherein the buffer layer and the transition layer are repeated, forming a superlattice.

4. The semiconductor device of claim 1, wherein the thickness of the third layer is at least 5 times greater than the thickness of the SPSL layer.

5. A semiconductor device comprising:
a buffer layer comprising:
a short-period superlattice (SPSL) layer having first sub-layers of a first material that alternate with second sub-layers of a second material, the first material and the second material being group III-N binary materials that are different from each other, wherein each of the first sub-layers and each of the second sub-layers has a sub-layer thickness greater than zero and less than or equal to 12 monolayers; and
a third layer that is a short-period superlattice comprising alternating fourth sub-layers and fifth sub-layers of group III-N materials, wherein a thickness or a composition of the fourth sub-layers or the fifth sub-layers is different from the first material and the second material;
wherein the SPSL layer forms a sandwich structure with the third layer;

wherein the buffer layer bends dislocations away from a growth direction of the buffer layer: and a transition layer on the buffer layer, the transition layer having a transition layer thickness, wherein: (i) the transition layer is an SPSL structure, with the transition layer thickness being greater than a thickness of one of the SPSL layers of the buffer layer, or (ii) the transition layer comprises the group III-N materials of the third layer, with the transition layer thickness being greater than a thickness of the third layer.

6. The semiconductor device of claim 1, wherein the third layer is AlGaN or InGaN.

7. A semiconductor device comprising:
a substrate;
a buffer layer on the substrate, the buffer layer comprising a plurality of repeating units, each repeating unit having:
a short-period superlattice (SPSL) layer, wherein the SPSL layer has alternating sub-layers of AlN and GaN, and each sub-layer has a sub-layer thickness greater than zero and less than or equal to 12 monolayers; and
an AlN layer having a thickness equal to or greater than the SPSL layer;
a transition layer on the buffer layer, the transition layer having a transition layer thickness and being one of: (i) an SPSL structure, with the transition layer thickness being greater than a thickness of each SPSL layer of the buffer layer, or (ii) AlN, with the transition layer thickness being greater than a thickness of each AlN layer of the buffer layer; and
a device stack on the transition layer, wherein the transition layer is adjacent to or forms part of the device stack;
wherein the buffer layer bends dislocations away from a growth direction of the device stack.

8. The device of claim 7, wherein the AlN sub-layers in the SPSL layer comprise greater than 50% composition of the SPSL layer.

9. The device of claim 7, wherein a monolayer ratio of the GaN sub-layers to the AlN sub-layers in the SPSL layer is 1:4.

10. The device of claim 7, wherein:
the buffer layer has 20 to 30 periods of the repeating units; and
the thickness of each SPSL layer is 10 nm to 25 nm.

11. The device of claim 7, further comprising a nucleation layer between the substrate and the buffer layer, the nucleation layer comprising AlN, AlGaN, GaN or an SPSL comprising one or more of AlN, AlGaN and GaN.

12. The device of claim 7, further comprising a nucleation layer between the substrate and the buffer layer, wherein the nucleation layer has a nucleation layer thickness of 150 nm to 250 nm.

13. The device of claim 12, wherein:
the buffer layer has 5 to 10 periods of the repeating units;
the thickness of each SPSL layer is 8 nm to 12 nm; and
the thickness of each AlN layer of the buffer layer is 90 nm to 110 nm.

14. The device of claim 12, wherein:
the buffer layer has a buffer layer thickness of 0.5 μm to 2 μm; and
the transition layer thickness is 0.5 μm to 1.5 μm.

15. The device of claim 7, wherein:
the thickness of each SPSL layer is 1-50 nm; and
the thickness of each AlN layer is 100-200 nm.

16. The device of claim 7, wherein the thickness of each of the AlN layers is at least 5 times greater than the thickness of each of the SPSL layers.

17. The device of claim 7, wherein the buffer layer comprises doping in one or more of: the AlN layers, the AlN sub-layers of the SPSL, and the GaN sub-layers of the SPSL.

18. The device of claim 7, wherein:
the SPSL layers of the buffer layer are n-doped; and
the transition layer is n-doped and is part of an n-region of the device stack.

19. The device of claim 7, wherein:
the substrate is sapphire;
the semiconductor device is a light emitting diode; and
the device stack comprises AlN and GaN.

20. The device of claim 7, wherein the semiconductor device is a light emitting diode having a target wavelength of less than 300 nm.

21. The semiconductor device of claim 5, wherein the buffer layer comprises a plurality of repeating units, a plurality of SPSL layers, and a plurality of third layers, each repeating unit consisting of one of the plurality of SPSL layers and one of the plurality of third layers.

22. The semiconductor device of claim 5, wherein the thickness of the third layer is at least 5 times greater than the thickness of the SPSL layer.

* * * * *

UNITED STATES PATENT AND TRADEMARK OFFICE
CERTIFICATE OF CORRECTION

| | |
|---|---|
| PATENT NO. | : 10,516,076 B2 |
| APPLICATION NO. | : 15/886220 |
| DATED | : December 24, 2019 |
| INVENTOR(S) | : Aderson et al. |

It is certified that error appears in the above-identified patent and that said Letters Patent is hereby corrected as shown below:

On the Title Page

Item (72) Inventors: Line 5, please add: Petar Atanackovic, Henley Beach South, (AU)

Signed and Sealed this
Sixth Day of June, 2023

Katherine Kelly Vidal
*Director of the United States Patent and Trademark Office*